(12) United States Patent
Pang

(10) Patent No.: US 9,735,212 B2
(45) Date of Patent: Aug. 15, 2017

(54) WHITE ORGANIC LIGHT EMITTING DISPLAY DEVICE, ORGANIC LIGHT EMITTING DISPLAY DEVICE AND METHOD FOR MANUFACTURING THE SAME

(71) Applicant: LG DISPLAY CO., LTD., Seoul (KR)

(72) Inventor: Heesuk Pang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 60 days.

(21) Appl. No.: 14/727,376

(22) Filed: Jun. 1, 2015

(65) Prior Publication Data
US 2015/0357388 A1    Dec. 10, 2015

(30) Foreign Application Priority Data
Jun. 10, 2014    (KR) .................. 10-2014-0069893

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *H01L 51/56* | (2006.01) |
| *H01L 51/50* | (2006.01) |

(52) U.S. Cl.
CPC ...... *H01L 27/3246* (2013.01); *H01L 27/3223* (2013.01); *H01L 27/3248* (2013.01); *H01L 51/5044* (2013.01); *H01L 51/56* (2013.01); *H01L 2227/323* (2013.01)

(58) Field of Classification Search
CPC ...... H01L 27/28; H01L 27/32–27/3297; H01L 51/5044; H01L 51/525; H01L 51/5012; H01L 33/005; H01L 33/08; H01L 51/5008
USPC ........ 257/40, 88, E33.061, E51.018; 438/34, 438/28, 29, 35, 99; 315/169.3
See application file for complete search history.

(56) References Cited

U.S. PATENT DOCUMENTS

| | | | |
|---|---|---|---|
| 2009/0009069 A1* | 1/2009 | Takata | ................ H01L 27/3246 313/504 |
| 2012/0217516 A1* | 8/2012 | Hatano | ................ H01L 51/525 257/88 |
| 2014/0103368 A1 | 4/2014 | Hatano et al. | |
| 2014/0103385 A1* | 4/2014 | Hatano | ............... H01L 51/5044 257/99 |

* cited by examiner

*Primary Examiner* — Thao X Le
*Assistant Examiner* — Nduka Ojeh
(74) *Attorney, Agent, or Firm* — Dentons US LLP

(57) ABSTRACT

Disclosed is an organic light emitting display device including an anode, a cathode, a plurality of organic layers and a partition member. The plurality of organic layers is disposed between the anode and the cathode, where at least one layer is separated to minimize current leakage into neighboring pixels. The partition member is disposed between the neighboring pixels and configured to separate the plurality of organic layers. The least one separated layer includes a charge generation layer. Because at least one layer is separated, current leakage into neighboring pixels can be minimized. Accordingly, defects resulting from light leakage and the mixing of colors of light from neighboring pixels may be reduced and display quality is enhanced.

14 Claims, 13 Drawing Sheets

WHITE ORGANIC LIGHT EMITTING DISPLAY DEVICE, ORGANIC LIGHT EMITTING DISPLAY DEVICE AND METHOD FOR MANUFACTURING THE SAME

CROSS-REFERENCE TO RELATED APPLICATIONS

This application claims priority to Korean Patent Application No. 2014-0069893 filed on Jun. 10, 2014, in the Korean Intellectual Property Office, the disclosure of which is incorporated herein by reference for all purposes as if fully set forth herein.

BACKGROUND OF THE INVENTION

Field of the Invention

The present disclosure relates to an organic light emitting display device. More particularly, the disclosure relates to an organic light emitting display device that reduces defects resulting from light leakage by dividing a charge generation layer into an active area and a non-active area, and a method for manufacturing the same.

Description of the Related Art

An organic light emitting diode (OLED) display device is a self-light emitting display device in which an organic light emitting layer is disposed between two electrodes. Electrons and holes are respectively injected from the two electrodes into the organic light emitting layer, and light is emitted by combining the injected electrons and holes.

OLED display devices can be classified into a top emission type, a bottom emission type, and a dual emission type based upon the emission directions of light. The devices can also be classified into an active matrix type and a passive matrix type based upon the manner in which the OLED display devices are driven.

A white OLED display device for emitting white light can be implemented by stacking organic emission layers for emitting red, green and blue light or by stacking organic emission layers for emitting light of colors that complement each other. Compared to a layer structure formed by independently patterning each of red, green and blue emission layers, the white OLED display device can be implemented by deposition process of the organic emission layers without patterning the respective organic emission layers. Thus, white OLED display devices are advantageous in realizing a high resolution and large-area device.

The white OLED display device is formed of a structure in which a plurality of organic emission layers are stacked. Also, it is provided with a charge generation layer (CGL) disposed between two neighboring organic emission layers to supply charges to the neighboring organic emission layers. Similar to the organic emission layers, the CGL is also formed through the deposition process, and is disposed in both an active area and non-active layer of the OLED display device.

SUMMARY OF THE INVENTION

As described above, a CGL needs to supply charges to neighboring organic emission layers. Accordingly, the CGL needs to be sufficiently thick. If the CGL is excessively thin, charges cannot be supplied sufficiently, and as a result a part of the active area of the OLED display device may fail to emit light.

As the CGL is formed to be thick to supply sufficient charges to the organic emission layers, another defect may occur. For example, since the CGL is connected to the active area and non-active area through the deposition process, an electric current may leak into a part of the CGL formed in the non-active area. Thereby, the part of the CGL formed in the non-active area serves as an electrode, and light leakage defect from the non-active area may increase. Light leakage from the non-active area may cause the mixing of colors of light from neighboring pixels, degrading the display quality.

To address the aforementioned problem, provided herein is an OLED display device having a new structure. The inventors found that by using a deposition process and at the same time separating the CGLs from each other, an OLED display device with the new structure, which minimizes light leakage defects and degradation of the display quality caused by the mixing of colors of light from neighboring pixels, can be developed.

An object of the present disclosure is to provide an organic light emitting display device capable of reducing current and light leakage by separately forming a CGL in an active area and a non-active area without a separate patterning process and a method for manufacturing the same.

Another object of the present disclosure is to provide an organic light emitting display device capable of reducing degradation of display quality caused by the mixing of colors of light from neighboring pixels by forming a plurality of partition layers having openings of different widths such that a dummy part having the same stack structure as an organic light emitting part formed in an active area is separately formed on the partition layers corresponding to a non-active area, and a method for manufacturing the same.

Another object of the present disclosure is to provide an organic light emitting display device capable of reducing defects such as disconnection between an anode and a cathode and enhancing the reliability thereof by adjusting the height of a partition layer for separating a CGL and a method for manufacturing the same.

It should be noted that objects of the present disclosure are not limited to the above-described objects, and other objects of the present disclosure will be apparent to those skilled in the art from the following descriptions.

According to an aspect of the present disclosure, there is provided an organic light emitting display device including an anode, a cathode, a plurality of organic layers and a partition member. The plurality of organic layers is disposed between the anode and the cathode, where the plurality of organic layers have at least one separated organic layer that minimizes current leakage into neighboring pixels. The partition member is disposed between the neighboring pixels and configured to separate the at least one of the organic layers. The aft least one separated layer includes a charge generation layer. As at least one layer is separated, leakage of current into neighboring pixels may be minimized. Thereby, defects resulting from light leakage and the mixing of colors of light from neighboring pixels may be reduced and thus display quality may be enhanced.

According to another aspect of the present invention, there is provided an organic light emitting display device including a thin film transistor disposed on a substrate, an anode connected to the thin film transistor, a first partition layer having a first opening configured to expose at least a portion of the anode, and a second partition layer disposed on the first partition layer having a second opening corresponding to the first opening. A width of the second opening is less than a width of the first opening. The organic light emitting display device also includes an organic light emitting part disposed on the anode. The organic light emitting part comprises a first part including at least one organic emission layer, a dummy part disposed on the second partition layer and configured to have the same stack structure as the first part, and the dummy part being separated from the first part. A cathode is disposed on the dummy part. As a result, defects resulting from light leakage and the mixing of colors of light from neighboring pixels may be reduced and thus display quality may be enhanced.

According to an embodiment of the present disclosure, a CGL is separately disposed in an organic light emitting display device without a separate patterning process, and thus defects caused by leaking light may be reduced.

In addition, a portion of an organic light emitting part is separately disposed in an active area and a non-active area when deposition process for the entire surface is applied, and thus the mixing of colors of light from neighboring pixels caused by current leakage and degradation of display quality may be suppressed.

Moreover, by adjusting the height of a partition layer for separating the CGL, operation-related defects such as disconnection between an anode and a cathode may be reduced and the reliability of the organic light emitting display device may be enhanced.

It should be noted that effects of the present disclosure are not limited to those described above and other effects of the present disclosure will be apparent to those skilled in the art from the following descriptions.

It is to be understood that both the foregoing general description and the following detailed description of the present disclosure are exemplary and explanatory and are not intended to specify essential limitations recited in the claims. Therefore, the scope of the claims is not restricted by the foregoing general description and the following detailed description of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENT

Figure 1:
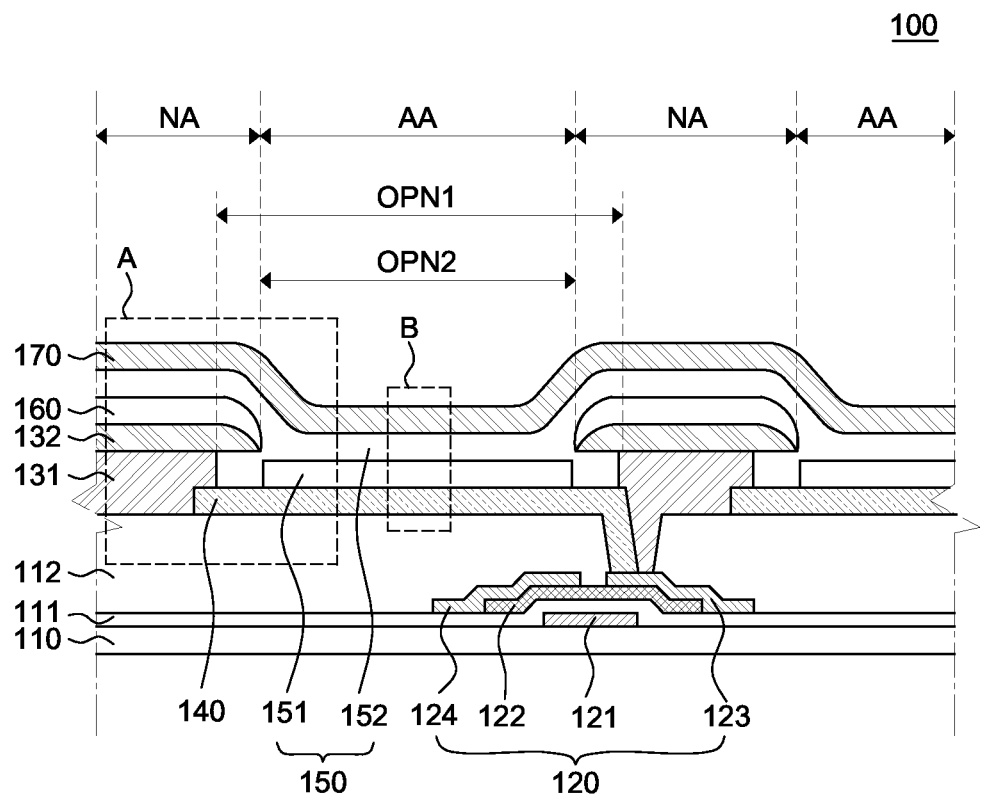
FIG. 1 is a cross-sectional view of an organic light emitting display device according to an embodiment of the present disclosure.

Advantages and features of the present disclosure and methods to achieve them will become apparent from the descriptions of exemplary embodiments herein below with reference to the accompanying drawings. However, the present disclosure is not limited to the exemplary embodiments disclosed herein but may be implemented in various different forms. The exemplary embodiments are provided to make the description of the present disclosure thorough and to fully convey the scope of the present disclosure to those skilled in the art. It is to be noted that the scope of the present disclosure is defined only by the claims.

The figures, dimensions, ratios, angles, numbers of elements given in the drawings are merely illustrative and are not limiting Like reference numerals denote like elements throughout the descriptions. Further, in describing the present disclosure, descriptions of well-known technologies may be omitted in order not to obscure the gist of the present disclosure.

It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even if explicit statements are not made.

In describing positional relationship using phrases such as "an element A on an element B," "an element A above an element B," "an element A below an element B" and "an element A next to an element B," another element C may be disposed between the elements A and B unless the term "immediately" or "directly" is explicitly used.

In describing temporal relationship, terms such as "after," "subsequent to," "next to," "before," and the like may include cases where any two events are not consecutive, unless the term "immediately" or "directly" is explicitly used.

In describing elements, terms such as "first" and "second" are used, but the elements are not limited by these terms. These terms are simply used to distinguish one element from another. Accordingly, as used herein, a first element may be a second element within the technical idea of the present disclosure.

Features of various exemplary embodiments of the present disclosure may be partially or fully combined. As will be clearly appreciated by those skilled in the art, technically various interactions and operations are possible. Various exemplary embodiments can be practiced individually or in combination.

Hereinafter, an organic light emitting display device according to an embodiment of the present disclosure will be described in detail with reference to the accompanying drawings.

FIG. 1 is a cross-sectional view of an organic light emitting display device according to an embodiment of the present disclosure. Referring to FIG. 1, an organic light emitting display device 100 includes a thin film transistor (TFT) 120, an anode 140, an organic light emitting part 150, a cathode 170, a first partition layer 131, a second partition layer 132 and a dummy part 160, which are disposed on a substrate 110.

The substrate 110 may include a transparent material, and be formed of glass, metal, or plastics.

The TFT 120 disposed on the substrate 110 includes a gate electrode 121, an active layer 122, a source electrode 123 and a drain electrode 124. As shown in FIG. 1, the gate electrode 121 is disposed on the substrate 110, and a first insulation layer 111 is disposed on the gate electrode 121 to cover the gate electrode 121. The active layer 122 is disposed on the first insulation layer 111 to overlap the gate electrode 121. The source electrode 123 and the drain electrode 124 spaced apart from each other are disposed on the active layer 122.

The gate electrode 121, the source electrode 123 and the drain electrode 124 are formed of a conductive material. For example, the gate electrode 121, the source electrode 123 and the drain electrode 124 may be formed of one of molybdenum (Mo), aluminum (Al), chromium (Cr), gold (Au), titanium (Ti), nickel (Ni), neodymium (Nd), copper (Cu) and alloys thereof, but embodiments of the present disclosure are not limited thereto. The gate electrode 121, the source electrode 123 and the drain electrode 124 may be formed of various materials.

The active layer 122 may be formed of one of amorphous silicon (a-Si), polycrystalline silicon (poly-Si), an oxide and an organic material, but embodiments of the present disclosure are not limited thereto.

The first insulation layer 111 may include a single layer or multiple layers formed of an inorganic material such as silicon oxide (SiOx), silicon nitride (SiNx), or the like.

While the TFT 120 is illustrated as having an inverted staggered structure in FIG. 1, it may have a coplanar structure.

A second insulation layer 112 is disposed on the TFT 120, and a part of the source electrode 123 is exposed through the second insulation layer 112. The second insulation layer 112 may include a single layer or multiple layers, and be formed of organic matter. Specifically, the second insulation layer 112 may be formed of a polyimide resin, an acrylic resin, or the like.

Although not shown in FIG. 1, a passivation layer may be disposed between the second insulation layer 112 and the TFT 120. The passivation layer may be formed of an inorganic material to protect the TFT 120. Similar to the second insulation layer 112, the passivation layer may expose a part of the source electrode 123.

The anode 140, which is connected to the source electrode 123, is disposed on the second insulation layer 112. Also, the first partition layer 131 with a first opening OPN1 exposing a part of the anode 140 is disposed on the anode 140. In addition, the second partition layer 132 with a second opening OPN2 is disposed on the first partition layer 131. As shown in FIG. 1, when the first opening OPN1 of the first partition layer 131 and the second opening OPN2 of the second partition layer 132 are viewed in the same cross section, the width of the second opening OPN2 is less than that of the first opening OPN1. That is, an end of the second partition layer 132 protrudes farther than a corresponding end of the first partition layer 131. Thus, the second opening OPN2 may become smaller than the first opening OPN1.

The first partition layer 131 may be formed of an inorganic insulation material, and the second partition layer 132 may be formed of an organic insulation material. However, embodiments of the present disclosure are not limited thereto.

The organic light emitting part 150 including at least one organic emission layer is disposed on the anode 140, and the cathode 170 is disposed on the organic light emitting part 150. Specifically, referring to FIG. 1, a first part 151 of the organic light emitting part 150 is disposed in an area of the anode 140 which does not overlap either the first partition layer 131 or the second partition layer 132, namely an active area AA. The dummy part 160, which has the same stack structure as the first part 151, is disposed on the second partition layer 132 corresponding to a non-active area NA. That is, a portion of the organic light emitting part 150 is separately disposed in the active area AA and the non-active area NA. In addition, a second part 152 of the organic light emitting part 150 is disposed to cover the dummy part 160 and the first part 151. Further, the cathode 170 is disposed on the second part 152 of the organic light emitting part 150. For reference, the anode 140, the first part 151 and second part 152 of the organic light emitting part 150 disposed to overlap the anode 140, and the cathode 170, which are disposed on the active area AA, operate as an organic light emitting element. Relevant detailed description will be given with reference to FIG. 3 later.

In the organic light emitting display device 100, the first part 151 of the organic light emitting part 150 and the dummy part 160 are separately disposed from each other due to the difference in width between the openings of the first partition layer 131 and the second partition layer 132. More specifically, the second partition layer 132 laterally protrudes farther than the first partition layer 131. Accordingly, when an organic material having low step coverage is deposited onto the anode 140, the material is separated into two parts by the difference in the degree of lateral protrusion between the first partition layer 131 and the second partition layer 132. Herein, step coverage refers to a capability to deposit a material having constant thickness on the bottom and wall surfaces of a trench or hole of a high aspect ratio, such as reverse taper structures. The organic material having low step coverage cannot reach and be deposited onto the lateral surface of the first partition layer 131, which is positioned further inward than the second partition layer 132. That is, as the first opening OPN1 has a greater width than the second opening OPN2, portions of the organic material may be separately disposed in the active area AA and the non-active area NA even without requiring a separate patterning process. Thus, a portion of the organic material positioned on the anode 140 forms the first part 151, and the other portion of the organic material positioned on the second partition layer 132 forms the dummy part 160.

Accordingly, in the organic light emitting display device 100, the partition layer disposed on the anode 140 includes the first partition layer 131 having the first opening OPN1 and the second partition layer 132 having the second opening OPN2 whose width is less than the width of the first opening OPN1. Thus, an organic material forming at least one organic emission layer may be separately disposed in the active area AA and the non-active area NA, namely the upper portions of the anode 140 and the second partition layer 132, without a separate patterning process. Moreover, the organic material forming the first part 151 of the organic light emitting part 150 and the dummy part 160 may also include a charge generation layer (CGL). As the CGL is also separately disposed in the active area AA and the non-active area NA, defects resulting from light leakage and the mixing of colors of light from neighboring pixels may be reduced.

Figure 2:
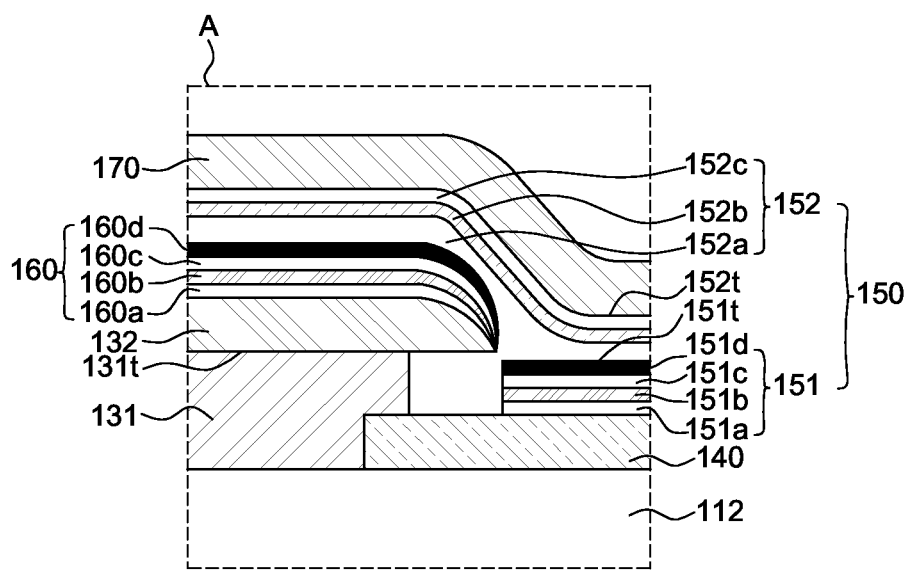
FIG. 2 is an enlarged view of region A shown in FIG. 1.

FIG. 2 is an enlarged view of region A shown in FIG. 1. FIG. 2 illustrates the stack structure of the organic light emitting part 150 and the dummy part 160 disposed on the active area AA and the non-active area NA in a more detailed manner.

The organic light emitting part 150 includes at least one organic emission layer and at least one CGL. Referring to FIG. 2, the organic light emitting part 150 includes the first part 151 and the second part 152. The first part 151 includes a first organic emission layer 151b and a CGL 151d, and the second part 152 includes a second organic emission layer 152b. The dummy part 160 having the same stack structure as the first part 151 of the organic light emitting part 150 is disposed on the second partition layer 132. More specifically, the first part 151 of the organic light emitting part 150 includes a first intermediate layer 151a, the first organic emission layer 151b, a second intermediate layer 151c and the CGL 151d, which are stacked one over another onto the anode 140. In addition, the dummy part 160 includes a first dummy layer 160a, a second dummy layer 160b, a third dummy layer 160c and a fourth dummy layer 160c, which are stacked one over another onto the second partition layer 132. Herein, the first intermediate layer 151a and the first dummy layer 160a are formed of the same material, and the first organic emission layer 151b and the second dummy layer 160b are formed of the same material. Also, the second intermediate layer 151c and the third dummy layer 160c are formed of the same material, and the CGL 151d and the fourth dummy layer 160c are formed of the same material. That is, each layer of the first part 151 and a corresponding layer of the dummy part 160 are simultaneously formed of the same material, thereby having the same stack structure.

As the organic material forming the first part 151 of the organic light emitting part 150 and the dummy part 160 includes materials of the first organic emission layer 151b and the CGL 151d, the CGL 151d is also separately disposed in the active area AA and the non-active area NA. Thereby, defects resulting from light leakage and the mixing of colors of light from neighboring pixels may be reduced.

The second part 152 of the organic light emitting part 150 is disposed on the first part 151 of the organic light emitting part 150, and the second part 152 contacts and covers the first part 151 and the dummy part 160 without being separated into parts. Referring to FIG. 2, the second part 152 has a stack structure constructed by stacking a third intermediate layer 152a, the second organic emission layer 152b and a fourth intermediate layer 152c one over another. The cathode 170 is disposed on the second part 152. As mentioned above, the anode 140, the first part 151 and second part 152 of the organic light emitting part 150, which are disposed to overlap the anode 140, and the cathode 170 operate as an organic light emitting element of the organic light emitting display device 100. Lights emitted from the first organic emission layer 151b the second organic emission layer 152b are mixed together to finally emit white light.

In order to separately dispose the CGL 151d and the fourth dummy layer 160c, which are formed of the same material, on the upper portion of the anode 140 and the upper portion of the second partition layer 132, an upper surface 131t of the first partition layer 131 may be positioned higher than an upper surface 151t of the first part 151. Or, it may be positioned in the same plane as the upper surface 151t of the first part 151. This means that the height of the first partition layer 131 is greater than or equal to the distance from the anode 140 to the first part 151 of the organic light emitting part 150. In other words, the thickness of the first partition layer 131 is greater than or equal to the sum of the thicknesses of the anode 140 and the first part 151. More specifically, this means that the thickness of the first partition layer 131 is greater than or equal to the sum of the thicknesses of the anode 140, the first intermediate layer 151a, the first organic emission layer 151b, the second intermediate layer 151c and the CGL 151d. Referring to FIG. 2, the upper surface 131t of the first partition layer 131 is disposed in a plane that is close to (or positioned a little higher than) the plane where the upper surface 151t of the first part 151, more particularly, the upper surface 151t of the CGL 151d which the uppermost layer of the first part 151 lies. Thereby, the CGL 151d may be ensured to be separately disposed in the active area AA and the non-active area NA.

Although not shown in the figure, if the upper surface 131t of the first partition layer 131 is positioned higher than the upper surface 151t of the CGL 151d, the uppermost layer of the first part 151 may become a part of the second part 152 of the organic light emitting part 150 rather than becoming the CGL 151d, more specifically, one of the third intermediate layer 152a, the second organic emission layer 152b and the fourth intermediate layer 152c. In this case, the uppermost layer of the dummy part 160 having the same stack structure of the first part 151 may be formed of the same material as one of the third intermediate layer 152a, the second organic emission layer 152b and the fourth intermediate layer 152c.

Meanwhile, the upper surface 131t of the first partition layer 131 may be positioned lower than an upper surface 152t of the organic light emitting part 150, specifically, the upper surface 152t of the fourth intermediate layer 152c corresponding to the uppermost layer of the second part 152. Or it may be positioned in the same plane as the upper surface 152t of the fourth intermediate layer 152c. This means that the height of the first partition layer 131 is less than or equal to the distance from the anode 140 to the second part 152 of the organic light emitting part 150. In other words, the thickness of the first partition layer 131 is less than or equal to the sum of the thicknesses of the anode 140, the first part 151, and second part 152 of the organic light emitting part 150. If the upper surface 131t of the first partition layer 131 is positioned higher than the upper surface 152t of the organic light emitting part 150, a defect is likely to be caused by the cathode 170. More specifically, if the upper surface 131t of the first partition layer 131 is positioned higher than the upper surface 152t of the organic light emitting part 150, both the first part 151 and second part 152 of the organic light emitting part 150 will be separately disposed in the active area AA and the non-active area NA by the aforementioned step coverage of the organic material. However, the cathode 170 is formed of a material having high step coverage rather than an organic material. Thus, it may be deposited by extending down along the lateral surface of the first partition layer 131 positioned further inward than the lateral surface of the second partition layer 132 and the exposed upper surface of the anode 140. As a result, the anode 140 comes in contact with the cathode 170, and thus an operation-related defect may be caused by disconnection.

In summary, for the organic light emitting display device 100, the CGL 151d may be separately disposed in the active area AA and the non-active area NA by positioning the upper surface 131t of the first partition layer 131 higher than the upper surface 151d of the CGL 151d of the organic light emitting part 150. Or it may be positioned in the same plane as the upper surface 151d of the CGL 151d. Thus, defects resulting from light leakage and the mixing of colors of light caused by, for example, current leaking into the non-active area NA, may be reduced. In addition, by positioning the upper surface 131t of the first partition layer 131 lower than or in the same plane as the upper surface 152t of the organic light emitting part 150, operation-related defects produced by disconnection between the anode 140 and the cathode 170 may be reduced. Thereby, the reliability of the organic light emitting display device 100 may be enhanced.

Figure 3:
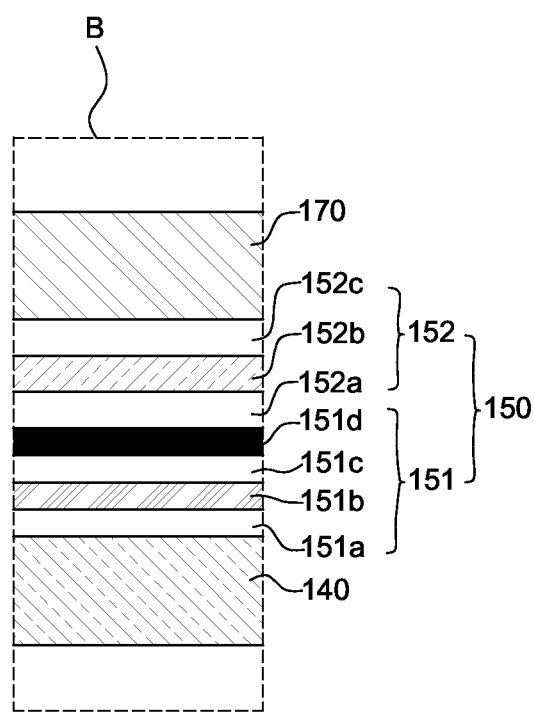
FIG. 3 is an enlarged view of region B shown in FIG. 1.

FIG. 3 is an enlarged view of region B shown in FIG. 1. FIG. 3 illustrates the stack structure of an organic light emitting element disposed in the active area AA.

As described above with reference to FIG. 2, by separately disposing a portion of the organic material including the CGL 151d on the upper portion of the anode 140 and the upper portion of the second partition layer 132, the CGL 151d may be prevented from causing current leaking into the non-active area NA. Thus, light is emitted from only the active area AA. That is, the dummy part 160 disposed in the non-active area NA does not emit light. As shown in FIG. 3, an organic light emitting element is disposed in the active area AA, and includes the anode 140, the first part 151 and second part 152 of the organic light emitting part 150 and the cathode 170. Hereinafter, each layer will be described in detail.

The anode 140 is a positive electrode for supplying holes. The anode 140 may be formed of transparent conductive oxide such as indium tin oxide (ITO), indium zinc oxide (IZO), or the like.

The cathode 170 is a negative electrode. The cathode 170 is formed of a material having high step coverage including a metal such as, for example gold (Au), silver (Ag), aluminum (Al), molybdenum (Mo), magnesium (Mg), or an alloy thereof.

The first intermediate layer 151a disposed on the anode 140 may include a signal layer of a hole injection layer (HIL) or hole transporting layer (HTL) or a combination of two layers. The HIL, which allows holes transported from the anode 140 to be smoothly injected into the first organic emission layer 151b, may enhance the interfacial and adhesive properties of the anode 140 formed of an inorganic material and the organic emission layer 151b formed of an organic material. The HTL, which is a layer serving to move injected holes to the organic emission layer 151b, may be formed of a material having high hole mobility.

The first organic emission layer 151b disposed on the first intermediate layer 151a includes a dopant and host. The first organic emission layer 151b emits light when electrons are combined with holes.

The second intermediate layer 151c disposed on the first organic emission layer 151b may be an electron transporting layer (ETL). The ETL serves to move electrons injected from the CGL 151d, which is positioned on the ETL, to the first organic emission layer 151b.

The CGL 151d, which is a source of supply of electrons and holes, supplies electrons or holes to the organic emission layers 151b and 152b adjacent thereto. The CGL 151d may have a dual structure with a P-type CGL and an N-type CGL or may consist of a single layer.

The third intermediate layer 152a, which may be an HTL, serves to move holes injected from the CGL 151d to the second organic emission layer 152b.

Similar to the first organic emission layer 151b, the second organic emission layer 152b includes a dopant and host, and emits light. As mentioned above, lights emitted from the first organic emission layer 151b and the second organic emission layer 152b are mixed to emit white light. For example, the first organic emission layer 151b may be a blue organic light emitting layer and the second organic emission layer 152b may be a yellow organic light emitting layer. However, embodiments of the present disclosure are not limited thereto. White light may be emitted through various combinations of light.

The fourth intermediate layer 152c includes a signal layer of an electron injection layer (EIL) or ETL or a combination of two layers. The EIL allows electrons transported from the cathode 170 to be smoothly injected into the second organic emission layer 152b.

The first intermediate layer 151a, the second intermediate layer 151c, the third intermediate layer 152a and the fourth intermediate layer 152c, which are auxiliary layers provided to enhance emission efficiency of the organic light emitting element 150, are not limited to the aforementioned structure. Each of the layers may be designed as one of or a combination of an HIL, an HTL, an EIL and an ETL.

Figure 4:
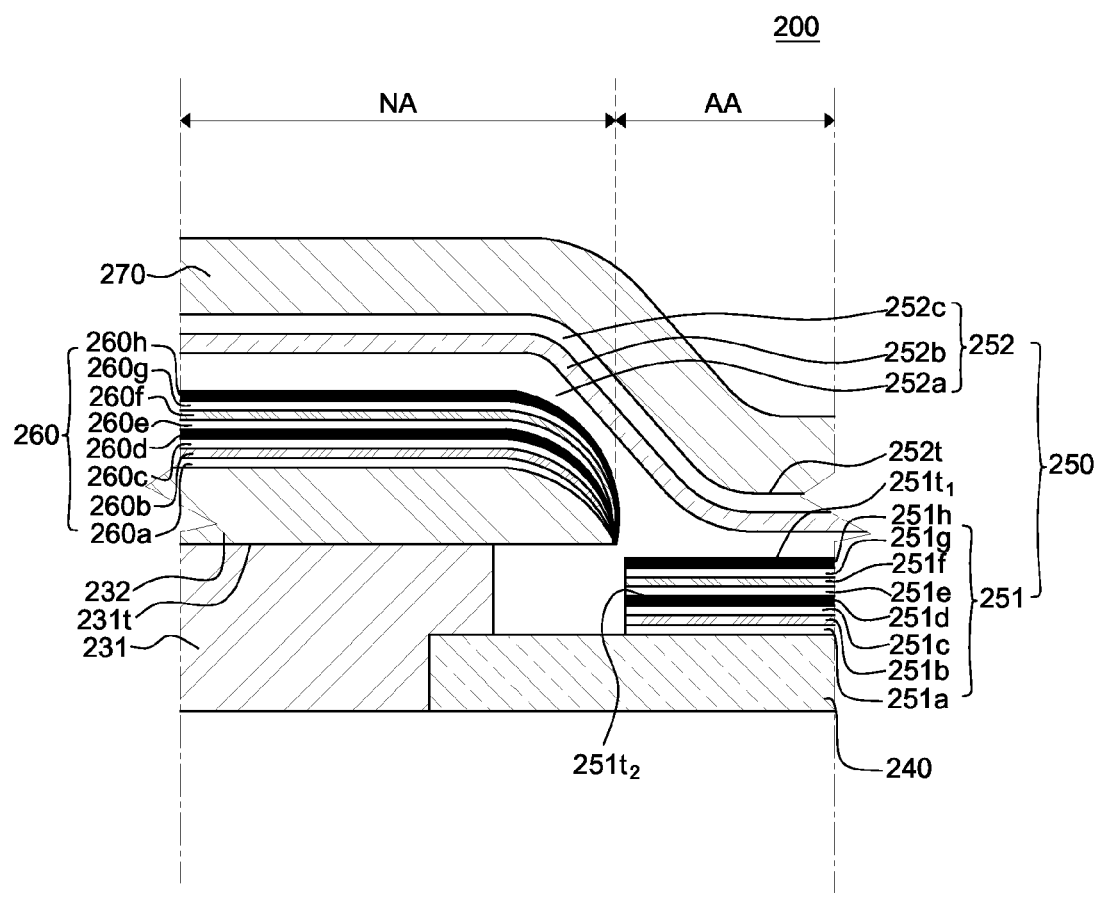
FIG. 4 is a cross-sectional view of an organic light emitting display device according to another embodiment of the present disclosure.

FIG. 4 is a cross-sectional view of an organic light emitting display device according to another embodiment of the present disclosure. In this embodiment, the organic light emitting part includes a plurality of CGLs. Description of constituents identical to or corresponding to constituents of the previous embodiment will be omitted.

Referring to FIG. 4, a first part 251 of an organic light emitting part 250 is disposed on an anode 240, and a first partition layer 231 is disposed on the edge of the anode 240. A second partition layer 232 laterally protruding farther than the first partition layer 231 is disposed on the first partition layer 231. Also a dummy part 260 having the same stack structure as the first part 251 of the organic light emitting part 250 is disposed on the second partition layer 232. In addition, a second part 252 of the organic light emitting part 250 is disposed on the first part 251 of the organic light emitting part 250 and the dummy part 260. The second part 252 is disposed without being separated into parts. A cathode 270 is disposed on the second part 252.

The organic light emitting part 250 may include a plurality of CGLs. As shown in FIG. 4, the first part 251 of the organic light emitting part 250 is formed by disposing a first intermediate layer 251a, a first organic emission layer 251b, a second intermediate layer 251c, a first CGL 251d, a third intermediate layer 251e, a second organic emission layer 251f, a fourth intermediate layer 251g and a second CGL 251h one over another. The dummy part 260 disposed on the second partition layer 232 is formed by stacking a first dummy layer 260a, a second dummy layer 260b, a third dummy layer 260c, a fourth dummy layer 260d, a fifth dummy layer 260e, a sixth dummy layer 260f, a seventh dummy layer 260g and an eighth dummy layer 260h one over another. Each layer of the dummy part 260 corresponds to a layer of the first part 251 and is formed of the same material as the corresponding layer of the first part 251.

Referring to FIG. 4, an upper surface 231t of the first partition layer 231 may be positioned higher than an upper surface 251t1 of the first part 251 of the organic light emitting part 250. Specifically, the upper surface 251t1 of the second CGL 251h is the uppermost layer of the first part 251. Or an upper surface 231t may be positioned in the same plane as the upper surface 251t1 of the second CGL 251h. This means that the height of the first partition layer 231 is greater than or equal to the distance from the anode 240 to the first part 251 of the organic light emitting part 250. In other words, the thickness of the first partition layer 231 is greater than or equal to the sum of the thicknesses of the anode 240 and the first part 251. More specifically, this means that the thickness of the first partition layer 231 is greater than or equal to the sum of the thicknesses of the anode 240, the first intermediate layer 251a, first organic emission layer 251b, second intermediate layer 251c, first CGL 251d, third intermediate layer 251e, second organic emission layer 251f, fourth intermediate layer 251g and second CGL 251h. Referring to FIG. 4, by positioning the upper surface 231t of the first partition layer 231 close to (or a little higher than) the plane where the upper surface 251t1 of the second CGL 251h lies, each of the first CGL 251d and the second CGL 251h can be separately disposed in an active area AA and a non-active area NA. In other words, each of the first CGL 251d and the second CGL 251H may not continuously extend over the active area AA and non-active area NA.

As mentioned above, if the upper surface 231t of the first partition layer 231 is positioned higher than the upper surface 251t1 of the CGL 251h, the uppermost layer of the first part 251 may be a part of the second part 252, more specifically, one of a fifth intermediate layer 252*a*, a third organic emission layer 252*b* and a sixth intermediate layer 252*c*, rather than the CGL 251*h*, of the organic light emitting part 250. In this case, the uppermost layer of the dummy part 260 having the same stack structure as the first part 251 may be formed of the same material as one of the fifth intermediate layer 252*a*, third organic emission layer 252*b* and sixth intermediate layer 252*c*.

Although not shown in the figure, only the first CGL 251*d* may be separately disposed depending on the structure and design of the organic light emitting part 250. If the upper surface 231*t* of the first partition layer 231 is positioned higher than the upper surface 251*t*2 of the first CGL 251*d* of the organic light emitting part 250 and lower than the upper surface 251*t*1 of the second CGL 251*h*, the first CGL 251*d* may be separately disposed on the upper portion of the anode 240 and the upper portion of the second partition layer 232. The second CGL 251*h* may be disposed without being separated into parts in a manner that the second part 252 of the organic light emitting part 250 shown in FIG. 4 is disposed.

Accordingly, when the organic light emitting part 250 of the organic light emitting display device 200 includes a plurality of CGLs 251*d* and 251*h*, the upper surface 231*t* of the first partition layer 231 may be positioned higher than the upper surface 251*t*2 of the first CGL 251*d* that is closer to the anode 240 than the other CGL 251*h*. Or the upper surface 231*t* may be positioned in the same plane as the upper surface 251*t*2 of the first CGL 251*d*. As a result, at least one CGL may be separately disposed in the active area AA and the non-active area NA, and thus current leakage due to the CGL may be reduced and light leakage and the mixing of colors of light may be suppressed.

The upper surface 231*t* of the first partition layer 231 may be positioned lower than the upper surface 252*t* of the organic light emitting part 250, specifically, the upper surface 252*t* of the sixth intermediate layer 252*c* which is the uppermost layer of the second part 252. Or the upper surface 231*t* may be positioned in the same plane as the upper surface 252*t* of the sixth intermediate layer 252*c*. This means that the height of the first partition layer 231 is less than or equal to the distance from the anode 240 to the second part 252 of the organic light emitting part 250. In other words, the thickness of the first partition layer 231 is less than or equal to the sum of the thicknesses of the anode 240, the first part 251 and second part 252 of the organic light emitting part 250. If the upper surface 231*t* of the first partition layer 231 is positioned higher than the upper surface 252*t* of the organic light emitting part 250, the cathode 270 having high step coverage may be deposited along the lateral surface of the first partition layer 231. The first partition layer 231 is positioned further inward than the second partition layer 232 and the exposed upper surface of the anode 240, as described above. Thus, an operation-related defect may be produced by disconnection between the anode 240 and the cathode 270.

In summary, the CGL may be separately disposed in the active area AA and the non-active area NA by positioning the upper surface 231*t* of the first partition layer 231 higher than or in the same plane as the upper surface 251*t*2 of the first CGL 251*d* of the organic light emitting part 250 or the upper surface 251*t*1 of the second CGL 251*h*. As a result, defects resulting from light leakage and the mixing of colors of light caused by, for example, current leaking into the non-active area NA, may be reduced. In addition, by positioning the upper surface 231*t* of the first partition layer 231 lower than or in the same plane as the upper surface 252*t* of the organic light emitting part 250, operation-related defects produced by disconnection between the anode 240 and the cathode 270 may be reduced. Thus, the reliability of the organic light emitting display device 200 may be enhanced.

FIGS. 5A to 5D are cross-sectional views illustrating openings according to structures of a partition layer. Hereinafter, openings according to structures and shapes of a partition layer will be described in more detail without describing the other constituents described above.

Figure 5A:
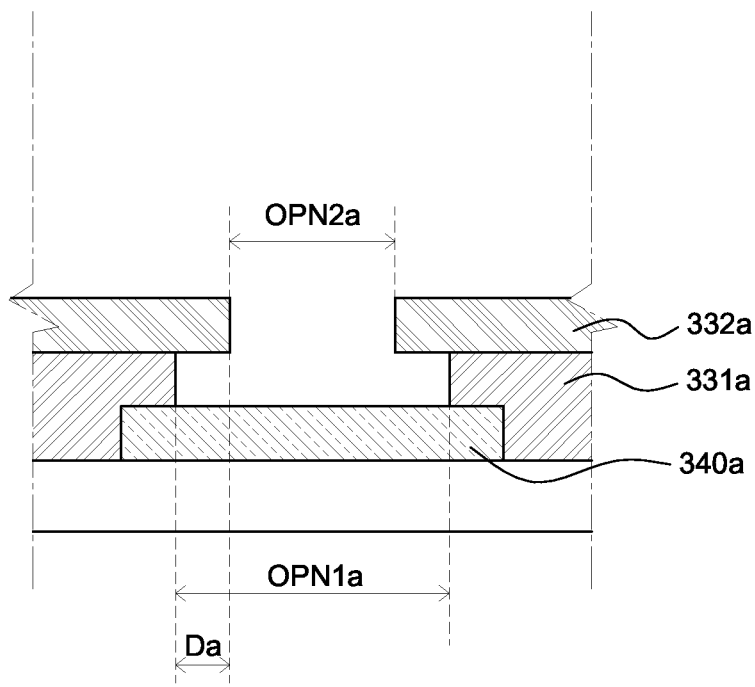
FIGS. 5A to 5D are cross-sectional views illustrating openings according to structures of a partition layer.

Referring to FIG. 5A, a first partition layer 331*a* having a first opening OPN1*a* configured to expose a portion of an anode 340*a* is disposed on the anode 340*a*. Also a second partition layer 332*a* having a second opening OPN2*a* is disposed on the first partition layer 331*a*. The second opening OPN2*a* may be disposed to overlap the first opening OPN1*a* and expose a portion of the anode 340*a*. The width of the second opening OPN2*a* may be less than that of the first opening OPN1*a* such that the second partition layer 332*a* laterally protrudes farther than the first partition layer 331*a*.

The degree of protrusion of the second partition layer 332*a* compared to the first partition layer 331*a* may be expressed by a distance from an end of the first partition layer 331*a* to an end of the second partition layer 332*a*. The degree of protrusion may correspond to a distance Da between the lateral surface of the first partition layer 331*a* and the lateral surface of the second partition layer 332*a* in the structure of the partition layer shown in FIG. 5A. The distance Da may be greater than 0.1 µm and less than the thickness of the second partition layer 332*a*. Preferably, the distance Da may be between 0.1 µm and 2 µm. If the distance Da between the lateral surface of the first partition layer 331*a* and the lateral surface of the second partition layer 332*a* is greater than the thickness of the second partition layer 332*a*, the second partition layer 332*a* disposed in a protruding manner may be collapsed down toward the anode 340*a* by gravity. Thus, an unexpected defect may occur in the partition layer as the partition layer is formed in an improper shape. For example, if the inclined lateral surface of the second partition layer 332*a* comes in contact with the anode 340*a*, the difference between the openings of the partition layer provided to separately dispose an organic material may be eliminated. Thus, the organic material may be continuously disposed rather than being properly separated into parts. As a result, light may leak into the non-active area. If the distance Da between the lateral surface of the first partition layer 331*a* and the lateral surface of the second partition layer 332*a* is less than 0.1 µm, there may be little difference between the width of the second opening OPN2*a* and the width of the first opening OPN1*a*. Thus, the effect of step coverage may hardly occur. As a result, the organic material may be continuously disposed without being properly separated into parts, and thus light leakage may occur in the non-active area.

Figure 5B:
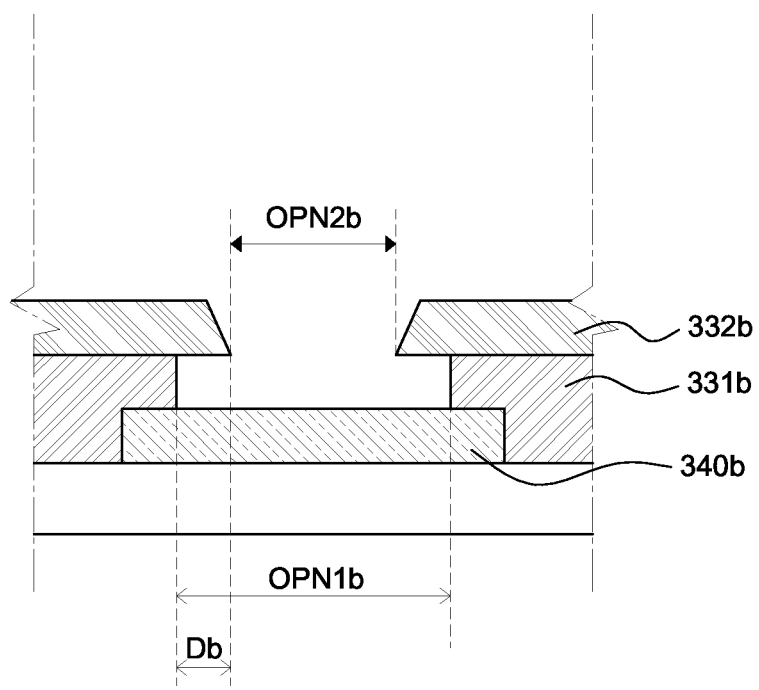

FIG. 5B shows a second partition layer 332*b* whose lateral surface has a different shape over the lateral surface shown in FIG. 5A. The other constituents shown in FIG. 5B are the same as those of FIG. 5A and thus description thereof will be omitted.

As shown in FIG. 5B, the lateral surface of the second partition layer 332*b* is inclined. More specifically, the lateral surface of the second partition layer 332*b* is inclined in a taper shape such that the upper portion of the lateral surface protrudes farther than the lower portion of the lateral surface. In this case, a second opening OPN2*b* may be defined based on the lower surface of the second partition layer 332*b*. The shape of the inclined lateral surface of the second partition layer 332b may be determined by a processing method, process conditions, and properties of a material forming the second partition layer 332b. The width of the second opening OPN2b may be less than the width of a first opening OPN1b, and the second opening OPN2b may be disposed to overlap the first opening OPN1b. The distance Db from an end of the first partition layer 331b to a corresponding end of the second partition layer 332b may be greater than about 0.1 µm and less than the thickness of the second partition layer 332b. Preferably, the distance Db may be between about 0.1 µm and 2 µm. In this case, the end of the first partition layer 331b corresponds to the lateral surface of the first partition layer 331b. Also the end of the second partition layer 332b corresponds to a portion of the inclined lateral surface of the second partition layer 332b that protrudes farther than the other portion of the lateral surface.

Figure 5C:
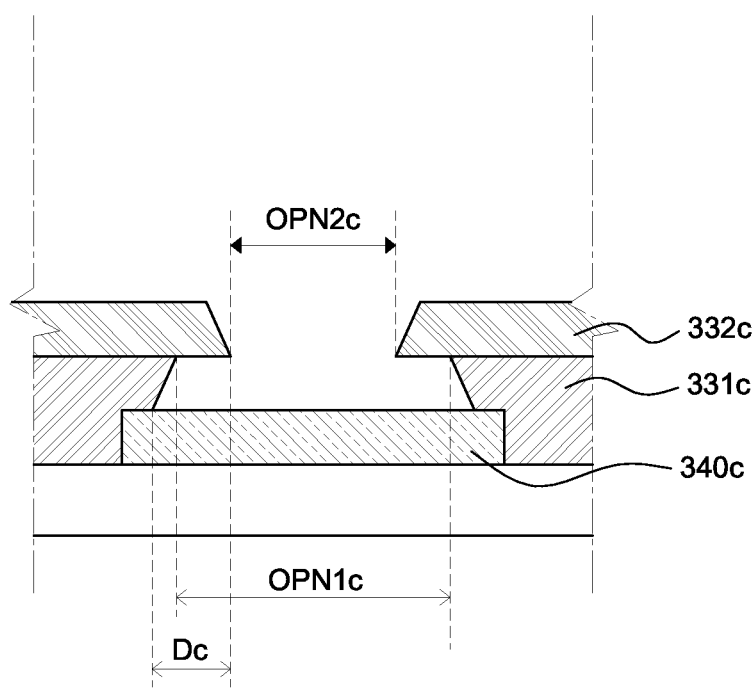

FIG. 5C shows a first partition layer 331c whose lateral surface has a different shape over the lateral surface shown in FIG. 5B. The other constituents shown in FIG. 5C are the same as those of FIG. 5B and thus description thereof will be omitted.

As shown in FIG. 5C, similar to a second partition layer 332c, the first partition layer 331c has an inclined lateral surface. More specifically, the lateral surface of the first partition layer 331c is formed in a reverse taper shape such that the upper portion of the lateral surface protrudes farther than the lower portion of the lateral surface. In this case, a first opening OPN1c may be defined based on the upper surface of the first partition layer 331c. The shape of the inclined lateral surface of the first partition layer 331c may be determined by a processing method, process conditions, and properties of a material forming the first partition layer 331c. The width of a second opening OPN2c may be less than that of the first opening OPN1c, and the second opening OPN2c may be disposed to overlap the first opening OPN1c. The distance Dc from an end of the first partition layer 331c to a corresponding end of a second partition layer 332c may be greater than 0.1 µm and less than the thickness of the second partition layer 332c. Preferably, the distance Dc may be between about 0.1 µm and 2 µm. In this case, the end of the first partition layer 331c corresponds to a portion of the inclined lateral surface of the first partition layer 331c that is dented further inward than the other portion of the lateral surface. Also, the end of the second partition layer 332c corresponds to a portion of the inclined lateral surface of the second partition layer 332c that protrudes farther than the other portion of the lateral surface.

Figure 5D:
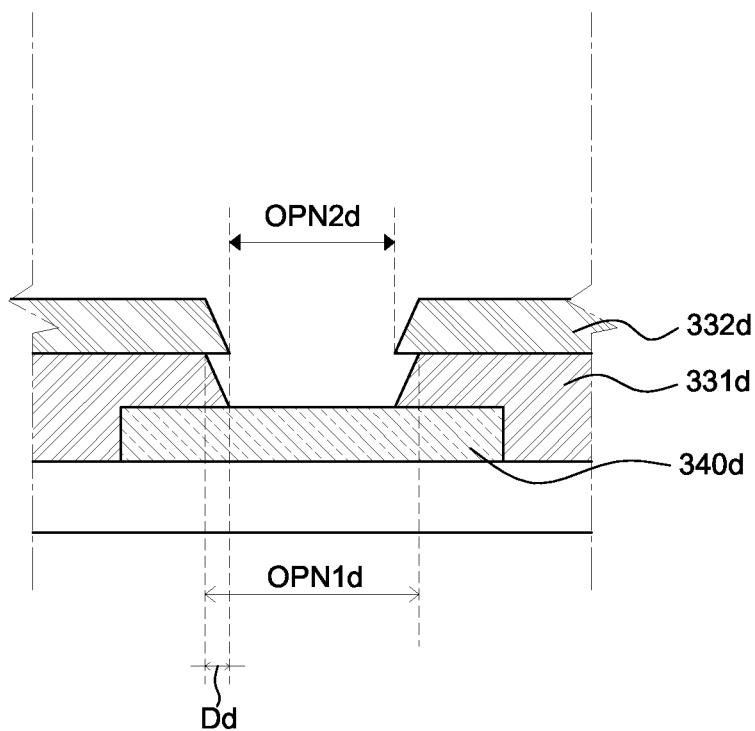

FIG. 5D shows a first partition layer 331d whose lateral surface has a different shape over the lateral surface shown in FIG. 5C. The other constituents shown in FIG. 5D are the same as those of FIG. 5C and thus description thereof will be omitted.

As shown in FIG. 5D, the lateral surface of the first partition layer 331d is inclined. More specifically, similar to a second partition layer 332d, the first partition layer 331d has a lateral surface formed in a taper shape such that the upper portion of the lateral surface protrudes father than the lower portion of the lateral surface. In this case, a first opening OPN1d may be defined based on the upper surface of the first partition layer 331d. The shape of the inclined lateral surface of the first partition layer 331d may be determined by a processing method, process conditions, and properties of a material forming the first partition layer 331d. The width of a second opening OPN2d may be less than that of the first opening OPN1d, and the second opening OPN2d may be disposed to overlap the first opening OPN1d. The distance Dd from an end of the first partition layer 331d to an end of a second partition layer 332d may be greater than about 0.1 µm and less than the thickness of the second partition layer 332d. Preferably, the distance Dd may be between about 0.1 µm and 2 µm. In this case, the end of the first partition layer 331d corresponds to a portion of the inclined lateral surface of the first partition layer 331d that is dented further inward than the other portion of the lateral surface. Also the end of the second partition layer 332d corresponds to a portion of the inclined lateral surface of the second partition layer 332d that protrudes farther than the other portion of the lateral surface.

Accordingly, referring to FIGS. 5A to 5D, when a cross section of an organic light emitting display device according to an embodiment of the present disclosure is viewed, the width of a first opening OPN1 of a first partition layer 331 is greater than that of a second opening OPN2 of a second partition layer 332. Further, the first opening OPN1 and the second opening OPN2 are disposed to overlap each other. In addition, the first opening OPN1 may be defined based on the upper surface of the first partition layer 331, and the second opening OPN2 may be defined based on the lower surface of the second partition layer 332. As an organic material having low step coverage is separately formed on the upper portion of the anode 340 corresponding to an active area and the upper portion of the second partition layer 332 corresponding to a non-active area by the aforementioned difference in width between the first opening OPN1 and the second opening OPN2, light leakage and the mixing of colors of light caused by current leaking into the non-active area may be suppressed.

FIGS. 6A to 6E are cross-sectional views illustrating a method for manufacturing an organic light emitting display device according to an embodiment of the present disclosure.

Figure 6A:
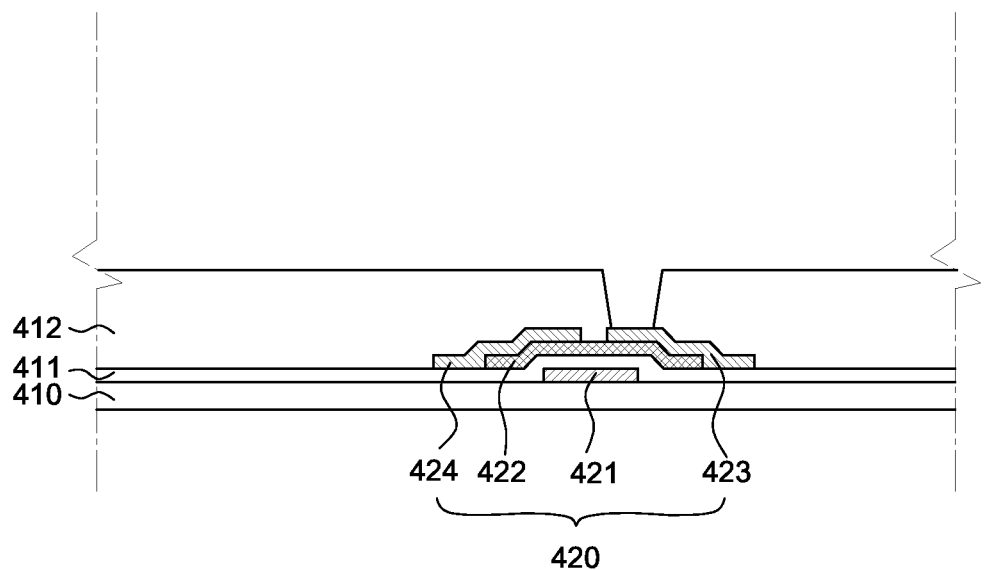
FIGS. 6A to 6E are cross-sectional views illustrating a method for manufacturing an organic light emitting display device according to an embodiment of the present disclosure.

Referring to FIG. 6A, a TFT 420 is formed on a substrate 410. Specifically, a conductive material is deposited onto the substrate 410 and patterning is performed to form a gate electrode 421. Then, a first insulation layer 411 formed of an insulation material is formed on the gate electrode 421. A semiconductor material is applied onto the first insulation layer 411 and then patterning is performed to form an active layer 422 such that the active layer 422 overlaps the gate electrode 421. After a conductive material is deposited onto the active layer 422, patterning is performed to form a source electrode 423 and a drain electrode 42 such that the source electrode 423 and the drain electrode 42 are spaced apart from each other. A second insulation layer 412 having a contact hole configured to expose a portion of the source electrode 423 is disposed on the TFT 420.

Figure 6B:
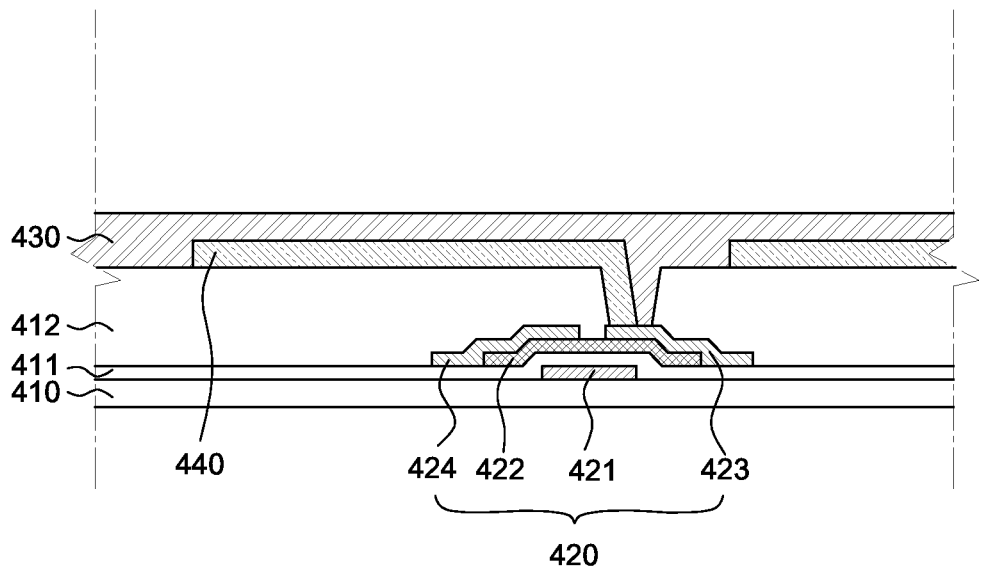

Next, referring to FIG. 6B, an anode 440 connected to the source electrode 423 through the contact hole of the second insulation layer 412 is formed on the second insulation layer 412. The anode 440 may be formed for each pixel by performing the patterning operation. Thereafter, an inorganic insulation film 430 formed of an inorganic insulation material is deposited onto the anode 440. The inorganic insulation film 430 may be formed of silicon oxide (SiOx) or silicon nitride (SiNx), but embodiments of the present disclosure are not limited thereto.

Figure 6C:
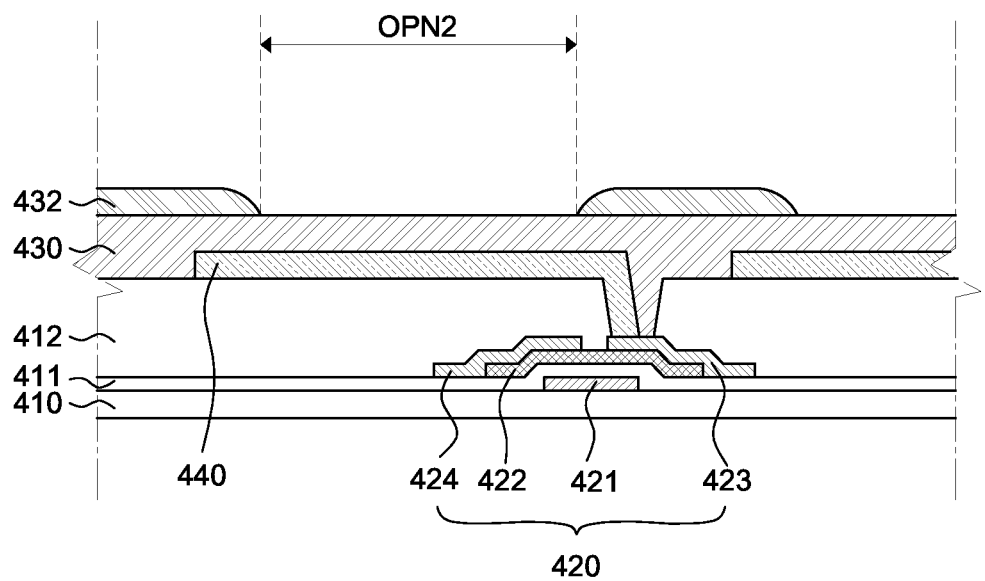

Next, referring to FIG. 6C, an organic insulation film formed of an organic insulation material is deposited on the entire inorganic insulation film 430. Then patterning is performed using, for example, photo resist to form a second partition layer 432. The second partition layer 432 is patterned to have a second opening OPN2, and the second opening OPN2 is formed to overlap the anode 440. The second partition layer 432 may be formed of a polyimide resin, an acrylic resin or a benzocyclobutene (BCB) resin, but embodiments of the present disclosure are not limited thereto.

Figure 6D:
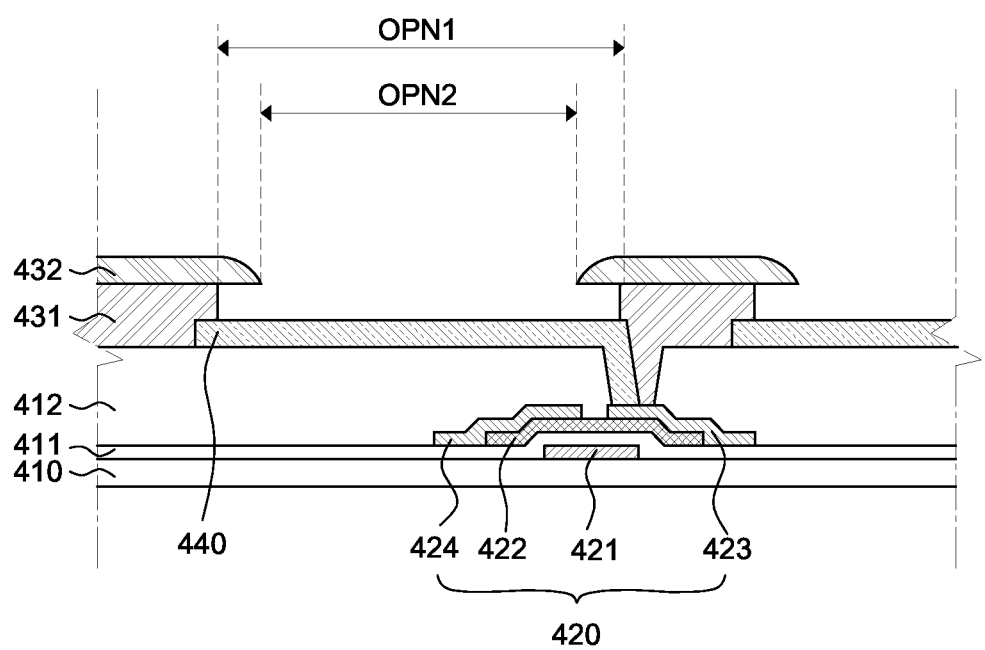

Next, referring to FIG. 6D, a first partition layer 431 is etched on the inorganic insulation film 430 using an etchant. In this operation, the second partition layer 432 serves as a mask of the inorganic insulation film 430. An end of the first partition layer 431 may be dented further inward than an end of the second partition layer 432 by adjusting a processing condition, particularly, a process time. That is, a portion of the inorganic insulation film 430 where the second partition layer 432 is not formed is removed by the etchant, and the lateral surface of the first partition layer 431 is gradually dented inward by the process time and the etchant. In this operation, the first partition layer 431 is provided with the first opening OPN1, and the first opening OPN1 is formed to have a greater width than the second opening OPN2.

Dry etching or wet etching may be used to form the first partition layer 431 depending on the type of the inorganic insulation film 430. In addition, the structures and shape of the first partition layer 431 and the second partition layer 432, more specifically, the shape of the lateral surface of each of the first partition layer 431 and the second partition layer 432 may be determined by processing conditions corresponding to properties of a material in use, a process time and a process environment. The lateral surfaces may have the structures described above with reference to FIGS. 5A to 5D.

Figure 6E:
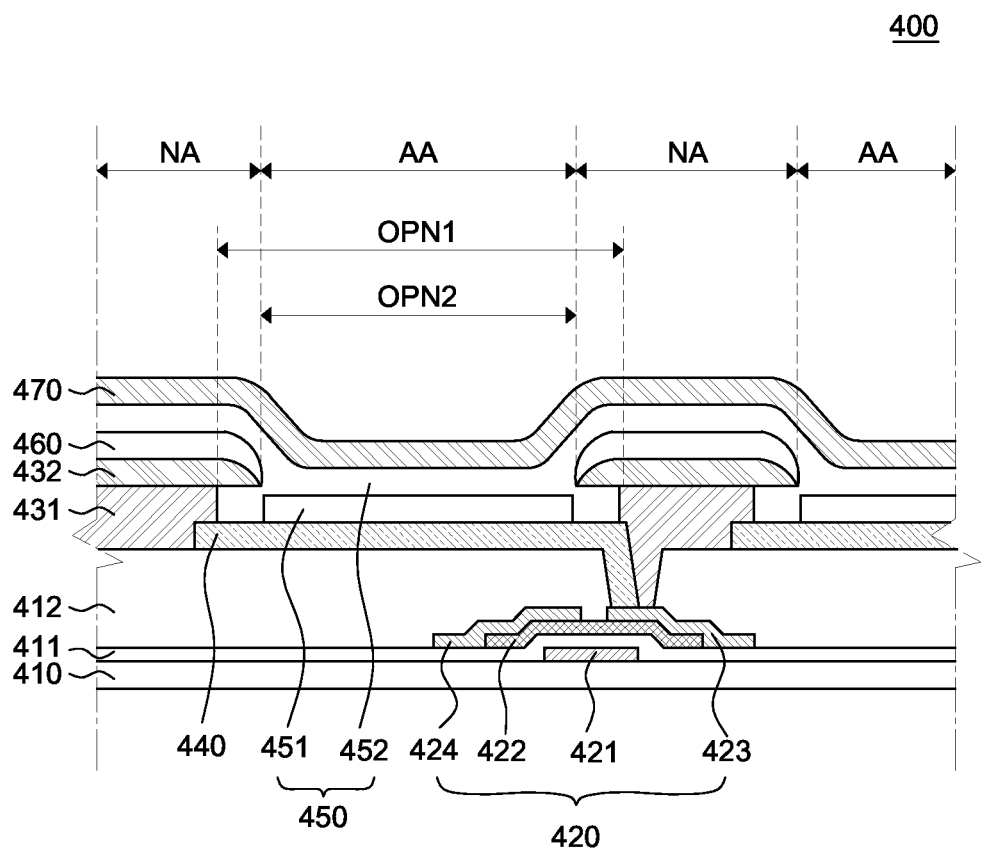

Lastly, referring to FIG. 6E, an organic material is deposited on the anode 440 and on the second partition layer 432. In this operation, the organic material having low step coverage is separately formed on the upper portion of the anode 440 and the upper portion of the second partition layer 432 due to the structure of the partition layers. That is, the organic material having low step coverage cannot reach the dented lateral surface of the first partition layer 431, and is thus discontinuously formed on the upper portion of the anode 440 and the upper portion of the second partition layer 432. Thus, a first part 451 of an organic light emitting part 450 and a dummy part 460 are simultaneously formed on the upper portion of the anode 440 and the upper portion of the second partition layer 432 respectively without being connected to each other. The first part 451 and the dummy part 460 have the same stack structure.

As described above, the height of the first partition layer 431 may be adjusted such that the first part 451 of the organic light emitting part 450 includes at least one CGL. Thereby, the CGL may be separately formed in the active area AA corresponding to the upper portion of the anode 440 and the non-active area NA corresponding to the upper portion of the second partition layer 432. Accordingly, light leakage and the mixing of colors of light caused by current leaking into the non-active area NA may be suppressed.

A second part 452 formed of an organic material is deposited onto the first part 451 of the organic light emitting part 450 and the dummy part 460. The second part 452 is deposited onto the active area AA and the non-active area NA without being separated into parts by the thickness of the organic material. In addition, a cathode 470 is formed on the second part 460.

According to the method for manufacturing the organic light emitting display device 400, as an organic material including a CGL is separately formed in the active area AA and the non-active area NA using the structures of the first partition layer 431 and the second partition layer 432 which have openings of different widths, display quality deteriorated by light leakage and the mixing of colors of light from neighboring pixels, which are caused by current leaking into the non-active area NA may be enhanced.

In an organic light emitting display device according to an embodiment of the present disclosure, the partition member may have an eaves shape that include a first partition layer having an opening and a second partition layer disposed on the first partition layer. Also, the second partition layer has an opening configured to overlap the opening of the first partition layer and is to be smaller than the opening of the first partition layer.

A height of the first partition layer may be greater than or equal to a distance from a top surface of the anode to a top surface of the CGL such that the CGL is separately formed in neighboring pixels.

Organic layers disposed between the anode and a specific layer of the plurality of organic layers may be separated by the partition member. Also organic layers between the specific layer and the cathode may be connected to each other in neighboring pixels, wherein at least one of the organic layers separated by the partition member may include the CGL.

In an organic light emitting display device according to another embodiment of the present disclosure, a first part may further include at least one CGL.

An organic light emitting part may include a second part disposed between the first part and a cathode, wherein the second part may be disposed to cover the first part and a dummy part.

The upper surface of the first partition layer may be positioned lower than or in the same plane as the upper surface of an organic light emitting part.

An upper surface of the first partition layer may be positioned higher than or in the same plane as the upper surface of the CGL.

When the organic light emitting part includes a plurality of CGLs, the upper surface of the first partition layer may be positioned higher than or in the same plane as the upper surface of a CGL disposed closest to the anode among the CGLs.

A lateral surface of at least one of the first partition layer and the second partition layer may be inclined.

A first opening may be defined based on the upper surface of the first partition layer, and a second opening may be defined based on the lower surface of the second partition layer.

A distance from an end of the first partition layer and an end of the second partition layer may be greater than 0.1 μm and less than thickness of the second partition layer.

The first partition layer may be formed of an inorganic insulation material, and the second partition layer may be formed of an organic insulation material.

A method for manufacturing an organic light emitting display device according to an embodiment of the present disclosure comprises forming an thin film transistor (TFT) on a substrate, forming an anode connected to the TFT, forming an inorganic insulation film on the anode, forming an organic insulation film on the inorganic insulation film and forming a second partition layer having a second opening by patterning the organic insulation film, forming a first partition layer having a first opening by patterning the inorganic insulation film such the anode is exposed, forming a first part positioned on the anode and a dummy part positioned on the second partition layer simultaneously by depositing an organic material onto the anode and the second partition layer, and depositing a cathode onto the first part and the dummy part. The first opening may be larger than the second opening.

The first part may be separated from the dummy part.

The first part may include at least one CGL.

The method may further include depositing a second part formed of an organic material onto the first part and the dummy part.

Forming the first partition layer may include patterning the inorganic insulation film using the second partition layer as a mask.

Exemplary embodiments of the present disclosure have been described in detail above with reference to the accompanying drawings. Those skilled in the art will appreciate that the present disclosure is not limited to the exemplary embodiments, and various modifications and variations can be made in the present disclosure without departing from the spirit or scope of the disclosure. Accordingly, the exemplary embodiments described herein are merely illustrative and are not intended to limit the scope of the present disclosure. The technical idea of the present disclosure is not limited by the exemplary embodiments. Therefore, the embodiments described herein should be construed in all aspects as illustrative and not restrictive. The scope of protection sought by the present disclosure should be determined by the appended claims and their legal equivalents, and all changes coming within the meaning and equivalency range of the appended claims are intended to be embraced therein.

What is claimed is:

1. A white organic light emitting display device comprising:
    an anode and a cathode;
    a plurality of organic layers between the anode and the cathode, wherein the plurality of organic layers have at least one separated organic layer that minimizes current leakage into neighboring pixels; and
    a partition member between the neighboring pixels configured to separate at least one of the organic layers,
    wherein the at least one separated organic layer comprises a charge generation layer, and wherein organic layers between the anode and a specific layer of the plurality of organic layers are separated by the partition member, and organic layers between the specific layer and the cathode are connected between the neighboring pixels,
    wherein at least one of the organic layers separated by the partition member comprises the charge generation layer.

2. The white organic light emitting display device according to claim 1, wherein the partition member has an eaves shape that comprises a first partition layer having an opening and a second partition layer on the first partition layer, and
    wherein the second partition layer has an opening configured to overlap the opening of the first partition layer and is smaller than the opening of the first partition layer.

3. The white organic light emitting display device according to claim 2, wherein a height of the first partition layer is greater than or equal to a distance from a top surface of the anode to a top surface of the charge generation layer such that the charge generation layer is separated between neighboring pixels.

4. The white organic light emitting display device according to claim 1, wherein the partition member comprises a first partition layer and a second partition layer on the first partition layer, and wherein the second partition layer laterally protrudes farther than the first partition layer.

5. An organic light emitting display device comprising:
    a thin film transistor on a substrate;
    an anode connected to the thin film transistor;
    a first partition layer having a first opening configured to expose at least a portion of anode;
    a second partition layer on the first partition layer having a second opening corresponding to the first opening;
    an organic light emitting part on the anode, wherein the organic light emitting part comprises a first part having at least one organic emission layer;
    a dummy part on the second partition layer configured to have same stack structure a; first part, the dummy part being separated from the first part;
    a cathode on the organic light emitting part and the dummy part, and wherein a width of the second opening is less than a width of the first opening, such that the dummy part and the first part are separated; and
    wherein the organic light emitting part further comprises a second part between the first part and the cathode,
    wherein the second part covers the first part and the dummy part.

6. The organic light emitting display device according to claim 5, wherein the first part further comprises at least one charge generation layer.

7. The organic light emitting display device according to claim 6, wherein an upper surface of the first partition layer is lower than or in the same plane as an upper surface of the organic light emitting part.

8. The organic light emitting display device according to claim 7, wherein the upper surface of the first partition layer is higher than or in the same plane as an upper surface of the charge generation layer.

9. The organic light emitting display device according to claim 8, wherein the organic light emitting part comprises a plurality of charge generation layers, the upper surface of the first partition layer is higher than or in the same plane as an upper surface of a charge generation layer positioned closest to the cathode among the plurality of charge generation layers.

10. The organic light emitting display device according to claim 5, wherein a lateral surface of at least one of the first partition layer and the second partition layer is inclined.

11. The organic light emitting display device according to claim 10, wherein the first opening is defined based on an upper surface of the first partition layer, and
    the second opening is defined based on a lower surface of the second partition layer.

12. The organic light emitting display device according to claim 5, wherein a distance from an end of the first partition layer and an end of the second partition layer is greater than 0.1 μm and less than a thickness of the second partition layer.

13. The organic light emitting display device according to claim 5, wherein the first partition layer is formed of an inorganic insulation material, and
    the second partition layer is formed of an organic insulation material.

14. The organic light emitting display device according to claim 5, wherein the second partition layer laterally protrudes farther than the first partition layer.

* * * * *